United States Patent [19]
Roberts et al.

[11] Patent Number: 4,599,636
[45] Date of Patent: Jul. 8, 1986

[54] TWO TERMINAL AXIAL LEAD SUPPRESSOR AND DIODE BRIDGE DEVICE

[75] Inventors: Ronald L. Roberts, Scottsdale; Willard E. Payne, Mesa, both of Ariz.

[73] Assignee: General Semiconductor Industries, Inc., Tempe, Ariz.

[21] Appl. No.: 587,392

[22] Filed: Mar. 8, 1984

[51] Int. Cl.⁴ .......................................... H01L 23/32
[52] U.S. Cl. ...................................... 357/76; 357/72; 363/53
[58] Field of Search ............... 174/52 P; 357/76, 72; 363/53, 60, 146

[56] References Cited

U.S. PATENT DOCUMENTS

| | | | |
|---|---|---|---|
| 3,134,935 | 5/1964 | Parsons et al. | 357/76 |
| 3,484,659 | 12/1969 | Nagai et al. | 357/76 |
| 3,566,192 | 2/1971 | Stump | 363/60 |
| 3,745,505 | 7/1973 | Turnbull et al. | 357/76 |
| 3,978,388 | 8/1976 | de Vries | 363/53 |
| 4,347,543 | 8/1982 | Frister et al. | 363/53 |

FOREIGN PATENT DOCUMENTS

| | | | |
|---|---|---|---|
| 2000831 | 10/1979 | Fed. Rep. of Germany | 363/60 |
| 2308205 | 11/1976 | France | 357/76 |

Primary Examiner—James W. Davie
Assistant Examiner—Vangelis Economou
Attorney, Agent, or Firm—Cahill, Sutton & Thomas

[57] ABSTRACT

An axial lead bridge rectifier includes four rectifying diode chips and a large pulse suppressor chip all disposed between the paddle sections of two coaxial leads. Two of the diodes are solder-connected in series between the two paddle sections, with their anodes solder-connected to a first cantilever conductive strip, the opposite end of which is soldered to one face of the pulse suppressor chip. The opposite face of the pulse suppressor chip is soldered connected to a second metal strip which extends in cantilever fashion from a solder connection to the cathodes of the other two diodes, which are also solder connected to the first and second paddle sections, respectively. The portion of the assembly including the paddle sections of the two axial leads and the rectifier bridge circuit and pulse suppressor thereof are encapsulated in suitable glass, plastic or ceramic material out of which the two axial leads extend.

11 Claims, 7 Drawing Figures

TWO TERMINAL AXIAL LEAD SUPPRESSOR AND DIODE BRIDGE DEVICE

BACKGROUND OF THE INVENTION

The invention relates to an axial lead semiconductor device, and especially to an inexpensive bridge rectifier device with an integral pulse suppressor chip, which is connected to protect electronic components from damage by large line overvoltages applied between the axial leads.

Axial lead semiconductor devices are well known, but their use has usually been limited to "packaging" of single chip diodes, which are solder-connected by means of preforms between two "nail head" or disc structures that are respectively attached to two opposed straight wire leads extending from the axial lead semiconductor devices. The two leads are coaxial, and extend in opposite directions from the package material (typically glass or ceramic) in which the semiconductor chip and the nail head or disk portions of the structure are encapsulated. In some instances, several individual chips solder-connected together in series fashion have been encapsulated in axial lead devices of the type mentioned above.

Simple axial lead semiconductor devices are popular because they are reliable and inexpensive to manufacture. Their low cost is partly due to the fact that the carriers or "boats" which are used in their manufacture are capable of holding large numbers, typically 1,000, of the axial lead devices during manufacture thereof. Conventional techniques are used utilizing vacuum pickup devices to place the individual solder preforms and semiconductor chips in cylindrical holes in which the bottom axial lead members are dropped so that the upper disk surfaces are horizontal. After the lower axial lead members, solder preforms, semiconductor diodes, and upper axial lead members have been positioned in the various holes in the boat, it is placed in an oven and its temperature is raised high enough to melt the solder preforms and thereby produce the desired electrical and mechanical interconnection of these elements. The boat is then removed from the oven, and the axial lead devices are then encapsulated, typically by transfer molding procedures.

However, the above described axial lead device structure has not been commonly used for assembly between the two disks of more than one semiconductor chip in side-by-side relationship because this technique would cause a great deal of difficulty in achieving convenient alignment of the solder preforms and the individual semiconductor chips. In no case has this technique been utilized for encapsulating multiple "stacks" of semiconductor chips in which intermediate conductive nodes need to be interconnected, because of the impracticality of positioning and soldering the various semiconductor chips and inter-node conductors that would be needed.

SUMMARY OF THE INVENTION

Accordingly, it is an object of the invention to provide a very low cost axial lead device with numerous individual chips connected in side by side relationship and having conductive interconnections between intermediate conductive nodes of the different "stacks" of semiconductor chips.

It is another object of the invention to provide a low cost rectifier bridge with an integral pulse suppressor chip therein and to provide a low cost practical method of manufacture thereof.

Briefly described, and in accordance with one embodiment thereof, the invention provides a bridge rectifier circuit including four rectifying diode chips and an overvoltage suppressor chip all in a single, inexpensive axial lead package, with the pulse suppressor chip being supported in cantilever fashion between first and second intermediate conductive metal members, the opposite ends of which are respectively sandwiched between two diodes "stacks" each consisting of two of the four diodes, each of the stacks of diodes being soldered between two "paddle" sections of two axial leads.

In the described embodiment of the invention the first axial lead includes an elongated stem or lead having an offset flat paddle parallel to the axis of the stem lead. The second axial lead includes a stem section that is coaxial with the stem of the first axial lead and also includes a parallel offset flat paddle section which is parallel to and spaced from the paddle section of the first axial lead. The four rectifying diodes, the first and second intermediate metal members, and the pulse suppressor chip are all disposed between the two paddle sections. The first rectifying diode has its anode solder-connected to the upper paddle section and its cathode solder-connected to the left end of the first intermediate metal conductor. The second diode has its anode solder-connected to the lower paddle surface and has its cathode solder-connected to the bottom surface of the first intermediate metal conductor. The right end of the first intermediate metal conductor is solder-connected to one electrode of the pulse suppressor chip, which may be either the cathode or the anode. The other electrode of the pulse suppressor chip is solder-connected to the left end of the second intermediate metal conductor. The third rectifying diode has its cathode solder-connected to the upper paddle section and its anode solder-connected to the upper surface of the right end of the second intermediate metal conductor. The fourth rectifying diode has its cathode solder-connected to the bottom paddle section and its anode solder-connected to the bottom right end surface of the second intermediate metal conductor. The portion of the assembly including the paddle leads, the four rectifying diodes and the pulse suppressor chip is encapsulated in a suitable cylindrical portion of ceramic, glass or plastic from which the first and second axial lead stems coaxially extend in opposite directions.

In the method of manufacturing the axial lead pulse suppressor bridge rectifier device of the present invention, the first axial lead is lowered into a guiding recess in a carrier boat so that the paddle section of that lead is horizontal and is positioned lower (by the offset amount) than the stem portion. Solder preforms are lowered onto opposed end portions of the first paddle surface through guide holes partially defined by vertical cylindrical holes in the carrier boat. Two of the rectifying diodes are placed on the two preforms. A removable spacer is positioned on the surface of the lower paddle section, approximately midway between the two first positioned diodes. An offset metal intermediate interconnecting strip is lowered into the guide recess in the carrier boat so that its left end rests on the removable spacer and its right end rests on a solder preform on top of the second diode. Solder preforms are lowered onto the first and second positioned diodes. A solder preform is placed on top of the right end of the offset metal strip. A third rectifying diode is lowered onto the solder preform resting on the right end of the first offset strip. A larger soldered preform is placed on the left end of the first offset metal strip above the removable spacer. The pulse suppressor chip is lowered onto the larger soldered preform. Semicylindrical walls of vertical guide holes in the carrier boat guide the lowering of all solder preforms and rectifying diode chips and the pulse suppressor chip. A large solder preform is lowered onto the upper surface of the pulse suppressor chip. A second offset metal strip conductor is positioned with its right end on the solder preform on top of the pulse suppressor chip and its left end on top of the solder preform resting on the first diode. A solder preform is placed on the upper surface of the left end of the second offset metal strip. The fourth diode is positioned on the last positioned solder preform. Solder preforms are placed on top of the third and fourth diodes. Finally, the second paddle lead is lowered into a matching elongated portion of the guide recess in the upper surface of the carrier boat so that the stem portion of the second axial lead is coaxial with the stem portion of the first axial lead and the offset paddle section of the second axial lead rests on top of the last positioned solder preforms. After this procedure has been completed for all of the axial lead pulse-suppressor bridge rectifiers to be constructed on the carrier boat, the carrier boat is placed in an oven. The temperature is raised high enough to melt all of the solder preforms, thereby achieving the desired electrical interconnection and rigid mechanical connection of all of the components of each bridge rectifier assembly. Then the axial lead bridge rectifier assemblies are cooled, removed from the carrier, and the removable spacers are all removed from each assembly. Each assembly is then subjected to a transfer molding procedure to encapsulate the entire assembly between the paddle lead sections of the first and second axial leads and a short portion of the stem of each axial lead.

DESCRIPTION OF THE INVENTION

Figure 3A:
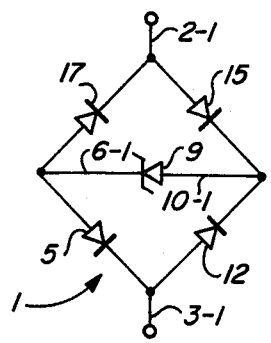
FIG. 3A is a schematic circuit diagram of one embodiment of the bridge rectifier circuit of the present invention.

Referring now to FIG. 3A, it first may be helpful to understand the schematic diagram of the bridge rectifier of the pulse suppressor bridge rectifier circuit of the present invention. In FIG. 3A, a first embodiment of the invention is shown, wherein bridge rectifier circuit 1 includes four rectifying diode chips 5, 12, 15 and 17 and a pulse suppressor chip 9. Each of these components is implemented by means of a separate semiconductor chip in accordance with the present invention. The cathodes of diode chips 5 and 17 are connected to conductor 6-1, which is also connected to the cathode of pulse suppressor chip 9. The cathodes of diode chips 12 and 15 are connected to conductor 10-1, which is also connected to the anode of pulse suppressor chip 9. The cathode of diode chip 17 and the anode of rectifier chip 15 are connected to bridge rectifier terminal 2-1, and the cathode of rectifier chip 5 and the anode of rectifier chip 12 are connected to the bridge rectifier terminal 3-1.

Figure 3B:
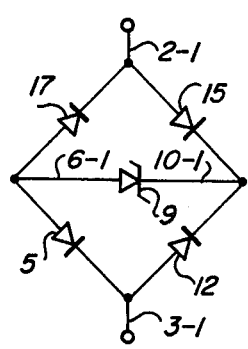
FIG. 3B is a schematic embodiment of the bridge rectifier shown in FIG. 3A with the polarity of the pulse suppressor chip reversed.

The schematic diagram in FIG. 3B is identical to that in FIG. 3A except that the direction of pulse suppressor chip 9 is reversed.

Figure 4:
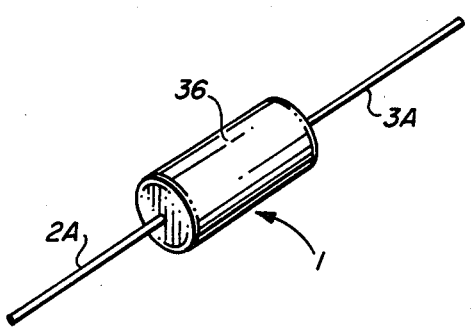
FIG. 4 is a perspective view of the completed axial lead pulse suppressor bridge rectifier circuit after encapsulation.

Next, it will be helpful to refer to FIG. 4 to see the type of package that the circuits of FIGS. 3A and 3B are packaged in in accordance with the present invention. In FIG. 4, reference numeral 1 again designates the completed pulse-suppressor bridge rectifier. Reference numeral 2A designates the wire lead portion of terminal 2-1 of FIG. 3A and FIG. 3B, and reference numeral 3A designates the straight axial wire lead portion of terminal 3-1 of FIG. 3A and FIG. 3B. Reference numeral 36 designates a ceramic or plastic or glass encapsulation material within which the rectifying diodes and the pulse suppressor chip are encapsulated. Typically, the diameter of leads 2A and 3A is 30 mils, and their respective lengths are at least one inch. Typically, the diameter of the cylindrical encapsulation section 36 is 0.2 inches and the length of encapsulation section 36 is typically 0.37 inches.

Typically, the rectifying diodes shown in FIGS. 3A and 3B may be low capacitance rectifier diodes implemented in chips having a diameter of 37 mils. Typically, the solder preforms such as 4, 37, 7, 8 etc. are circular, and have a diameter of about 52 mils. The pulse suppressor chip 9 can be a square TRANSZORB chip having an edge dimension of approximately 80 mils. TRANSZORB is a registered trademark of the present assignee.

Figure 1:
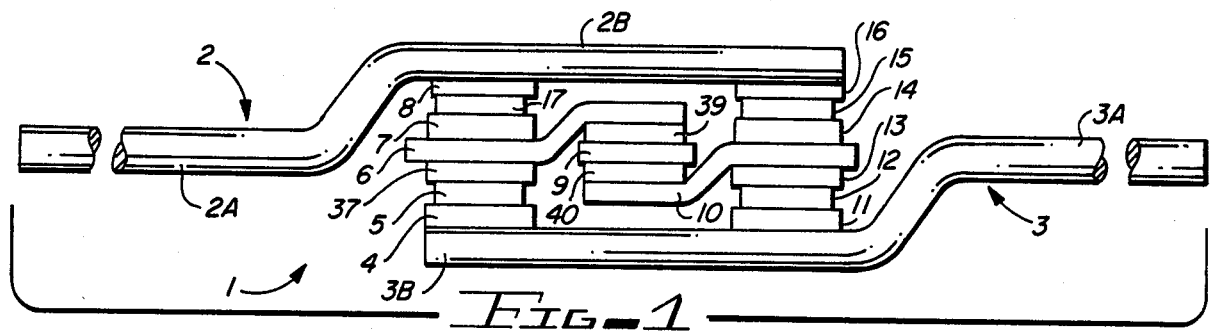
FIG. 1 is a section view of the axial lead pulse-suppressor bridge rectifier assembly of the present invention prior to encapsulation.

The structure of the pulse suppressor bridge rectifier of the present invention now may be best explained with reference to FIGS. 1 and 2, wherein reference numeral 3 designates an axial lead having a straight stem or lead proportion 3A and a flat, thin, widened "paddle" portion 3B. Reference numeral 2 designates an opposite axial lead having a stem or lead portion 2A and a thin, flattened paddle portion 2B. The flattened surfaces of paddle sections 2B and 3B are horizontal, and are offset as indicated in FIG. 1.

A solder preform 4 is attached to the upper surface of paddle section 3B at the left end thereof, and is also attached to the lower surface of diode chip 5. Another solder preform 37 is attached to the upper surface of diode 5 and is also attached to the lower surface of the left end of an offset conductive metal strip 6. Another solder preform 7 is attached to the upper surface of the left portion of offset silver (or silver clad copper) strip 6 and is also attached to the bottom electrode surface of diode chip 17. A solder preform 8 is attached to the upper electrode surface of diode 17 and to the lower left surface of paddle section 3B.

Offset strip 6 has the lower surface of its right end attached by means of solder preform 39 to the upper surface of pulse suppressor chip 9. The lower electrode surface of pulse suppressor chip 9 is attached by means of solder preform 40 to the upper surface of the left portion of a second offset strip 10. The lower surface of the right hand portion of offset strip 10 is attached by means of solder preform 13 to the upper surface of diode chip 12. The lower electrode surface of diode chip 12 is attached by means of solder preform 11 to the upper surface of the right hand portion of paddle section 3B. The upper surface of the right hand portion of offset strip 10 is connected by solder preform 14 to the lower electrode surface of diode chip 15. The upper electrode surface of diode chip 15 is attached by solder preform 16 to the lower surface of the right hand end portion of paddle section 2B.

Figure 2:
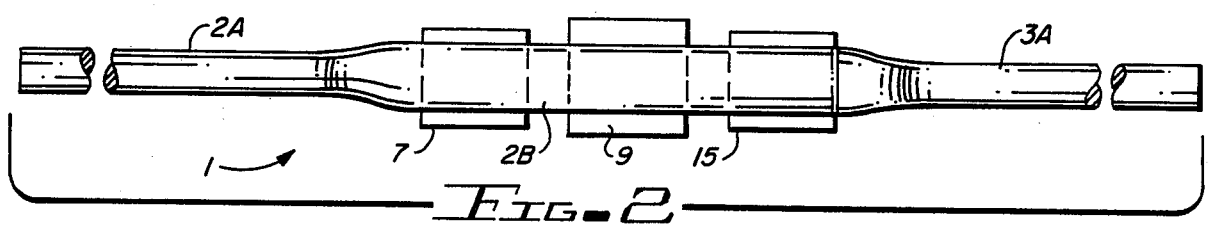
FIG. 2 is a top view of the assembly as shown in FIG. 1.

The top view diagram in FIG. 2 generally illustrates the relative sizes of the stem portions of the axial leads and the paddle portions thereof.

Typically, the axial lead members 2 and 3 are composed of silver or copper clad iron coated with silver.

The sizes of the solder preforms used for connection to the diodes and the sizes of the diodes are such that each extends slightly beyond each opposite parallel edge of the paddle sections 2B and 3B, so that semicylindrical walls in the carrier boat used in manufacture of the pulse-suppressor bridge rectifier device can effectively aid in guiding and alignment of the various diodes and solder preforms as they are lowered into recesses in the surface of the carrier boat. Ordinarily, the pulse suppressor chip 9, and consequently the preforms used for attaching it to the offset lead members 6 and 10, are substantially larger than the "rectifying" diode chips.

Thus, it is seen that the diodes form two spaced "stacks" disposed between the upper and lower paddle sections 2B and 3B, respectively, and pulse suppressor chip 9 is suspended in a "cantilever fashion" between paddle sections 2B and 3B by means of the offset members 6 and 10. In accordance with the present invention, this structure provides a very economical axial lead configuration supporting a much more complex circuit structure than has previously been implemented using axial-lead technology. This results in an extremely low cost pulse suppressor bridge rectifier circuit. Despite the complexity of the structure, the manufacturing cost is not as high as would be expected, due to the inventive technique for manufacturing the device using a novel carrier boat, a portion 20 of which is shown in FIGS. 5A and 5B.

Figure 5A:
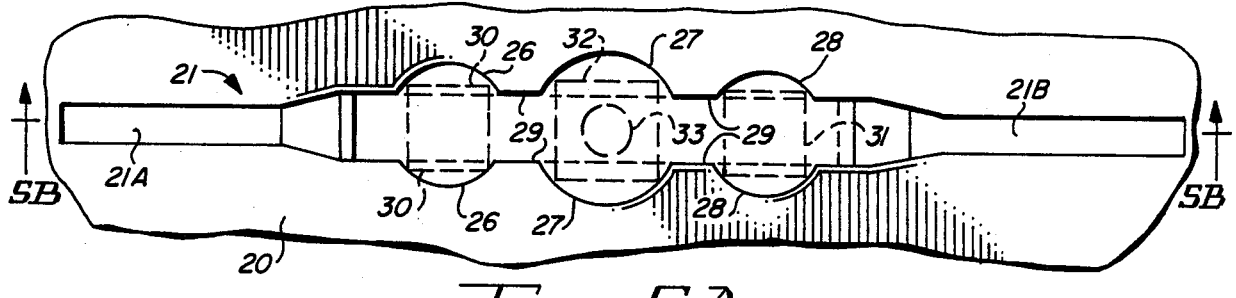
FIG. 5A is a top view of a portion of a carrier boat used in manufacture of the device of FIG. 1.
Figure 5B:
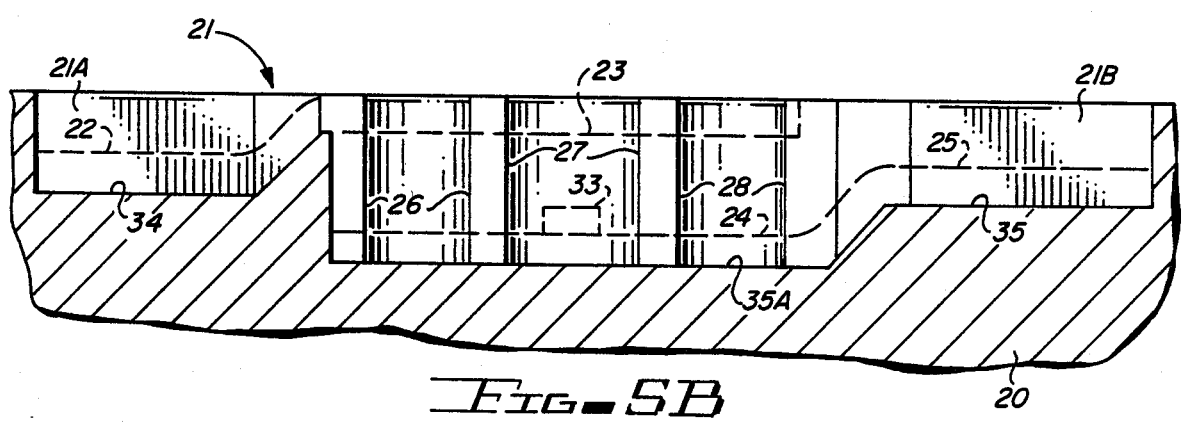
FIG. 5B is a section view of the view shown in FIG. 5A.

Referring now to FIG. 5A, the top view of a portion of carrier boat 20 is illustrated, showing the guide recesses in the top surface of the carrier boat into which the various components shown in FIGS. 1 and 2 are lowered, using conventional vacuum pick-up techniques in order to construct a pulse-suppressor bridge rectifier circuit in accordance with the present invention. FIG. 5B shows a side section view of the same portion of the carrier boat 20. Typically, approximately 125 such recesses into which 125 pulse-suppressor bridge rectifier circuits can be essentially simultaneously constructed are included in a single carrier boat. In FIG. 5A, reference numeral 21 generally designates the guide recess for manufacture of one of the devices shown in FIG. 1. Reference numerals 21A and 21B designate the portions of the guide recess 21 into which the stem portions 2A and 3A of the axial leads 2 and 3 are lowered. In FIG. 5B, dotted lines 22 and 23 show the final position of axial lead 2, and dotted ines 24 and 25 show the location of axial lead 3.

In FIG. 5A, reference numeral 26 designates semicylindrical wall portions of the guide recess 21, which facilitate guiding and aligning of the solder preforms and diode chips 4, 5, 37, 6 7, 17 and 8. Dotted lines 30 designates the final location of these chips and solder preforms. Reference numeral 28 designates semicylindrical portions of the guide recess 21 in which the solder preforms and diodes 11, 12, 13, 14, 15 and 16 are aligned and dotted lines 31 indicate the final location of these diodes and preforms. Reference numerals 27 designates semicylindrical wall portions of guide recess 21 which are used for alignment of the preforms 39 and 40 and pulse suppressor chip 9 during the manufacturing process. Dotted line 33 designates the location of the above-mentioned removable spacer, which also is designated by reference numeral 33 in FIG. 5B. Reference numerals 32 in FIG. 5A generally designate the location of solder preforms 39 and 40 and pulse suppressor chip 9. Thus, it can be seen that the size of the semicylindrical walls of guide recess 21 allow precise positioning of the various solder preforms and chips during the manufacturing operation.

In the manufacturing operation, the first step is to position axial lead 3 in guide recess 21 in a location indicated by dotted lines 25 and 24. Then solder preforms 4 and 11 are positioned guided by semicylindrical walls 26 and 28, respectively as they are lowered. Then, the diodes 5 and 12 are precisely positioned on preforms 4 and 11, respectively. Next, solder preforms 37 and 13 are positioned on the upper surfaces of diodes 5 and 12. Next, the removable spacer 33 is placed on the upper surface of paddle section 3B in a location indicated by reference numerals 33 in FIGS. 5A and 5B. Next, offset strip 10 is positioned on the removable spacer 33 above solder preform 13. Next, solder preform 40 is placed on top of the left hand surface portion of offset member 10. Pulse suppressor chip 11 is then lowered onto solder preform 40. Solder preform 39 is placed on top of pulse suppressor chip 9. Then, offset member 6 is placed on top of solder preform 39 and solder preform 37, as shown in FIG. 1. Next, and in a similar fashion, the solder preforms 7, 14, diode chips 17 and 15, and solder preforms 8 and 16 are stacked in the appropriate order, as indicated in FIG. 1. Then, the second axial lead 2 is positioned at a location indicated by dotted lines 22 and 23 in FIG. 5B. Then, after this has been accomplished for all devices to be assembled on the carrier boat, the carrier boat is placed in an oven and raised to a high enough temperature to cause melting of all of the solder preforms, thereby both electrically and mechanically attaching and connecting the respective assemblies rigidly together. Then, the carrier boat is removed from the oven and the removable spacers 33 all are removed. Then the device is subjected to a suitable transfer molding process to provide the encapsulation 36 shown in FIG. 4.

Thus, the above-described device and method produce a pulse-protected bridge rectifier circuit with all components integrally contained in an economical, easily manufactured axial lead package.

While the invention has been described with reference to a particular embodiment thereof and method of making, those skilled in the art will be able to make various modifications to the described structure and method without departing from the true spirit and scope of the invention. For example, it is not necessary that all of the various chips, preforms and intermedial metal conductors be lowered into the carrier in exactly the same order as recited above. For example, preform 1, diode 12, preform 13, intermediate conductor 10, preform 14, diode 15, and preform 16 could all be lowered into the carrier boat before preform 4 is lowered.

We claim:

1. An axial lead semiconductor device including in combination:
   (a) a pulse suppressor semiconductor chip;
   (b) first, second, third and fourth diode chips connected to form a bridge rectifier circuit;
   (c) first and second axial lead elements each including a lead wire section and a paddle section with a flat surface;
   (d) first conductive means for attaching a cathode of said first diode to said paddle section of said first axial lead element;
   (e) second conductive means for attaching an anode of said second diode to said paddle section of said first axial lead element;
   (f) third conductive means for attaching a cathode of said third diode to said paddle section of said second axial lead element;
   (g) fourth conductive means for attaching an anode of said fourth diode to said paddle section of said second axial lead element;
   (h) first conductive cantilever means supported at a first end thereof by said first and third diodes for supporting said pulse suppressor chip at a second end thereof;
   (i) second conductive cantilever means supported at a first end thereof by said second and fourth diodes for supporting said pulse suppressor chip at a second end thereof;
   (j) fifth conductive means for attaching the anodes of said first and third diodes to said first end of said first conductive cantilever means;
   (k) sixth conductive means for attaching the cathodes of said second and fourth diodes to said first end of said second conductive cantilever means;
   (l) seventh conductive means for attaching a first electrode of said pulse suppressor semiconductor chip to the second end of said first conductive cantilever means; and
   (m) eighth conductive means for attaching a second electrode of said pulse supressor semiconductor chip to the second end of said second conductive cantilever means.

2. The axial lead semiconductor device of claim 1 wherein said first, second, third, fourth, fifth, sixth, seventh and eighth conductive means each include a layer of solder.

3. The axial lead semiconductor device of claim 2 wherein said first electrode of said pulse suppressor semiconductor chip is a cathode and the second electrode thereof is an anode.

4. The axial lead semiconductor device of claim 2 wherein said first electrode of said pulse suppressor semiconductor chip is an anode and the second electrode thereof is a cathode.

5. The axial lead semiconductor device of claim 2 including transfer molded encapsulation material encapsulating said paddle section of said first and second axial lead elements, all of said first, second, third and fourth diode chips, said pulse suppressor semiconductor chip, all of said first through said eighth conductive means, and said first and second conductive cantilever means.

6. The axial lead semiconductor device of claim 5 wherein said first and second conductive cantilever means each include an offset strip of silver material.

7. The axial lead semiconductor device of claim 6 wherein each of said first, second, third and fourth diode chips and said pulse suppressor semiconductor chip extend beyond both opposed edges of each of said paddle sections of said first and second axial lead elements.

8. The axial lead semiconductor device of claim 7 wherein said lead wire sections of said first and second axial lead elements are coaxial.

9. The axial lead semiconductor device of claim 8 wherein said paddle section of each of said axial lead elements is offset from the lead wire section thereof, and the flat surfaces of said paddle sections are parallel to each other.

10. The axial lead semiconductor device of claim 9 wherein said encapsulation material is composed of the group consisting of silicon and epoxy.

11. An axial lead semiconductor device including in combination:
    (a) first, second, third and fourth semiconductor chips connected to form a circuit;
    (b) first and second axial lead elements each including a lead wire section and a paddle section with a flat surface;
    (c) first conductive means for attaching a terminal of said first semiconductor chip to said paddle section of said first axial lead element;
    (d) second conductive means for attaching a terminal of said second semiconductor chip to said paddle section of said first axial lead element;
    (e) third conductive means for attaching a terminal of said third semiconductor chip to said paddle section of said second axial lead element;
    (f) first conductive cantilever means supported at a first end thereof by said first and third chips for supporting said fourth semiconductor chip at the other end thereof;
    (g) second conductive cantilever means supported at a first end thereof by said second semiconductor chip for supporting said fourth semiconductor chip at a second end thereof;
    (h) fifth conductive means for attaching predetermined terminals of said first and third semiconductor chips to said first end of said first conductive cantilever means;
    (i) sixth conductive means for attaching predetermined terminals of said third semiconductor chip to said first end of said second conductive cantilever means;
    (j) seventh conductive means for attaching a first electrode of said fourth semiconductor semiconductor chip to the second end of said first conductive cantilever means; and
    (k) eighth conductive means for attaching a second electrode of said fourth semiconductor semiconductor chip to the second end of said second conductive cantilever means.

* * * * *